United States Patent
Kuang

(10) Patent No.: US 6,642,873 B1
(45) Date of Patent: Nov. 4, 2003

(54) MULTI-LEVEL D/A CONVERTER INCORPORATED WITH MULTI-LEVEL QUANTIZER IN MULTI-BIT SIGMA-DELTA A/D CONVERTER

(76) Inventor: Wensheng Vincent Kuang, 26 Baton Court, Kanata, Ontario (CA), K2L 4C8

(*) Notice: Subject to any disclaimer, the term of this patent is extended or adjusted under 35 U.S.C. 154(b) by 0 days.

(21) Appl. No.: 10/159,671

(22) Filed: Jun. 3, 2002

(51) Int. Cl.[7] .............................. H03M 1/78; H03M 3/00
(52) U.S. Cl. ...................................... 341/143; 341/154
(58) Field of Search ................................. 341/143, 150, 341/118, 120, 159, 154; 340/14.63

(56) References Cited

U.S. PATENT DOCUMENTS 4,399,439 A * 8/1983 Upadhyayula ........... 340/14.63
5,049,882 A * 9/1991 Gorecki et al. ............. 341/143
5,274,375 A * 12/1993 Thompson .................. 341/143
5,696,508 A * 12/1997 Gross et al. ................ 341/118

FOREIGN PATENT DOCUMENTS

EP   1162683   * 12/2001

* cited by examiner

*Primary Examiner*—Patrick Wamsley

(57) ABSTRACT

A Multi-level digital-to-analog (D/A) converter is incorporated with a multi-level quantizer in a multi-bit sigma-delta analog-to-digital (A/D) converter. The multi-level D/A converter is realized by feeding back reference voltages of the multi-level quantizer through a switch. The summation of electrical energy from multiple D/A converter elements found in conventional D/A converters is avoided so that element mismatch and circuit complexity are reduced significantly in the multi-bit sigma-delta A/D converter.

16 Claims, 4 Drawing Sheets

MULTI-LEVEL D/A CONVERTER INCORPORATED WITH MULTI-LEVEL QUANTIZER IN MULTI-BIT SIGMA-DELTA A/D CONVERTER

BACKGROUND OF THE INVENTION

The invention relates generally to oversampling analog-to-digital (A/D) converters, and particularly to multi-bit sigma-delta A/D converters with reduced element mismatch and circuit complexity.

Sigma-delta A/D converter is an oversampling A/D converter, also referred to as sigma-delta modulator, delta-sigma A/D converter, and delta-sigma modulator. The sigma-delta A/D converter has been successfully applied in communications and other signal processing areas. Conventional sigma-delta A/D converters rely on large oversampling ratio and 1-bit quantizer to ensure linearity and simple circuit implementation, as described in J. C. Candy and G. C. Temes: "Oversampling delta-sigma data converters", IEEE Press, New York 1992.

Compared to the 1-bit sigma-delta A/D converter, a multi-bit sigma-delta A/D converter is more stable and provides large dynamic range and high resolution without increasing the oversampling ratio. FIG. 1 illustrates the basic principle of the multi-bit sigma-delta A/D converter. An analog input signal is fed into the converter through the first input terminal of summer 101. The output of the summer is coupled to loop filter 102, which is either one or more low-pass filters so-called integrators for low-pass or baseband applications, or one or more band-pass filters for bandpass applications. The loop filter 102 can be continuous time or discrete-time filters. The output of the loop filter 102 is still analog (continuous or discrete-time) signal and it is coupled to N-level quantizer 103. The N-level quantizer 103 is a flash-type analog-to-digital converter and converts analog signal into digital thermometer code. A thermometer code is a code where all of the bits are equally weighted. For example, a 4-bit binary code converted to a thermometer code would require 15 equally weighted bits (the "all bits off" state does not require an out bit). If the input number was "8", then the thermometer code would have the bottom 8 bits set to "1" and the top 7 bits set to "0" (An inverted form, where the bottom bits are set to "0" and the top bits are set to "1" may also be referred to as a thermometer code). The digital output of the quantizer 103 is fed back through N-level digital-to-analog (D/A) converter 104 to the second input terminal of the summer 101 negatively, and that completes the feedback loop, the core of the sigma-delta A/D converter. The digital output of the quantizer 103, in the form of thermometer code, is also coupled to encoder 105, which transforms the thermometer code into binary. The output of the encoder 105 is coupled to decimator 106, which filters out noise and finally outputs a data word of high resolution at a rate much lower than the oversampling rate.

However, a drawback associated with the multi-bit sigma-delta A/D converter is nonlinear effect called element mismatch, which is primarily caused by the N-level D/A converter in the feedback path of the multi-bit sigma-delta A/D converter. In the N-level D/A converter, a plurality of elements such as capacitors, resistors, current sources, and the like, are configured in such a way that a selected number of the elements release their electrical energy into a summing junction that produces an analog output signal equivalent to the digital input.

FIG. 2 illustrates the basic principle of the N-level D/A converter incorporated with first stage integrator of a sigma-delta A/D converter, where a 5-level switched-capacitor D/A converter is illustrated as an example. Five switches, 21, 22, 23, 24, and 25, are controlled by feedback digital thermometer code; the switches' on or off actions charge or discharge five correspondent capacitors labelled as C1, C2, C3, C4, and C5. The energy in the five capacitors is then summed at a feedback capacitor labelled as C through the simple summing circuit comprising op-amp 28. The analog output of the op-amp 28 represents the digital control signal. Variation inevitably exists among the elements due to manufacturing variation, temperature, aging, etc. Although the absolute error from one element to another can be tightly controlled, the cumulative effect of the mismatched elements can cause significant nonlinear distortion. The element mismatch problem does not arise in 1-bit case because perfect linearity is guaranteed by virtue of the fact that only a single element is used to convert the digital signal to analog.

There are some known techniques of tackling the element mismatch problem in the multi-bit sigma-delta A/D conversion. For example, precise laser trimming technique can reduce the element mismatch but is of high cost; calibration and recalibration techniques work but need additional circuit and processing power.

FIG. 3 illustrates another known technique of digitally correcting the error at the output of encoder 105 by introducing digital correction unit 301 between the encoder 105 and the decimator 106. The digital correction unit 301 may use a RAM-based LUT (look up table) to convert the nonlinearly distorted output readings into correct output data words.

Another known technique of tackling the D/A converter element mismatch is dynamic element matching, in which the D/A converter elements are randomly selected. The Random selection of the elements spreads the nonlinear error across the spectrum, making it like white noise, as described by R. Carely, "A noise-shaping coder topology for 15+bit converter," IEEE Journal of Solid-State Circuits, pp. 267–273, Apr. 1989. FIG. 4 illustrates that a random selection functional block 401 is inserted between the N-level D/A converter 104 and the output of the N-level quantizer 103. A particular dynamic element matching technique is called data weighted averaging (DWA) method that can shape the noise introduced by the DAC element mismatch, as described by R. T. Baird and T. S. Fiez, "Linearity enhancement of multi-bit sigma-delta A/D and D/A converters using data weighted averaging," IEEE Transactions of Circuits and Systems II, pp. 753–762, Dec. 1995.

More recently, some particular implementations of the dynamic element matching technique have been proposed. See, for example, Chen et al., U.S. Pat. No. 6,304,608, issued Oct. 16, 2001 and entitled "Multi-bit Sigma-delta Converters Employing Dynamic Element Matching With Reduced Baseband Tones"; and Friend et al., U.S. Pat. No. 6,218,977, issued Apr. 17, 2001 and entitled "Methods and Apparatus for Distributing Mismatched Error Associated with Data Converter Elements".

It is noted that the known techniques of tackling the element mismatch in the multi-bit sigma-delta A/D converter are either of high cost and/or add circuit complexity.

It is therefore an object of the present invention to provide a novel multi-level D/A converter that is incorporated with a multi-level quantizer in the multi-bit sigma-delta A/D converter, so that it actually reduces both the circuit complexity and the element mismatch significantly.

BRIEF SUMMARY OF THE INVENTION

In the present invention, a multi-level digital-to-analog (D/A) converter is incorporated with a multi-level quantizer in a milti-bit sigma-delta analog-to-digital (A/D) converter. The multi-level D/A converter is realized by feeding back reference voltages of the multi-level quantizer through a switch, which is controlled by the output of the quantizer through a logic unit. Summation of electrical energy from D/A converter elements, which is found in conventional D/A converters, is avoided so that the element mismatch and circuit complexity of the sigma-delta AID converter are reduced significantly. The multi-level D/A converter incorporated with the multi-level quantizer according to the present invention comprises: N comparators, a switch having single pole and N throws, a voltage divider network of dividing a voltage reference signal into various voltage levels that are applied to the N comparators and to the switch, and a switching control logic unit of controlling the switch.

A multi-bit sigma-delta A/D converter can be made using the multi-level D/A converter according to the present invention. The multi-bit sigma-delta A/D converter comprises: a summer, a loop filter, N comparators, a switch having single pole and N throws, a voltage divider network of dividing a voltage reference signal into various voltage levels that are applied to the N comparators and to the switch, a switching control logic unit of controlling the switch, an encoder, and a decimation filter.

Other features and advantages of the present invention should become apparent from the following detailed description of the invention and the accompanying drawings.

BRIEF DESCRIPTION OF THE DRAWING

Reference is made to the attached drawings, wherein elements having the same labels represent like elements throughout the drawings and wherein.

DETAILED DESCRIPTION OF THE INVENTION

Figure 1:
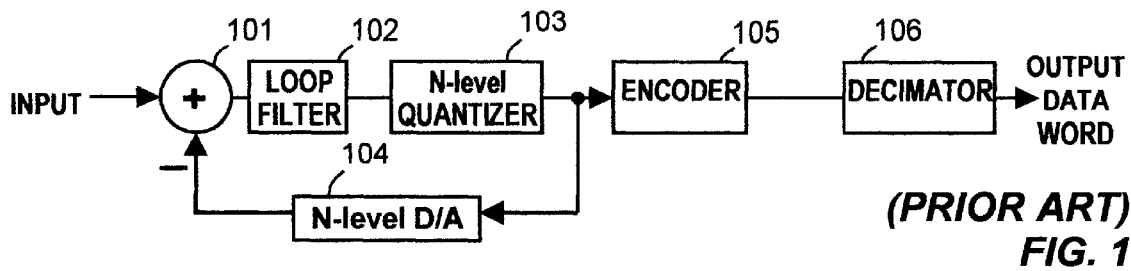
FIG. 1 illustrates a block diagram of a multi-bit sigma-delta analog-to-digital (A/D) converter known in the prior art.
Figure 2:
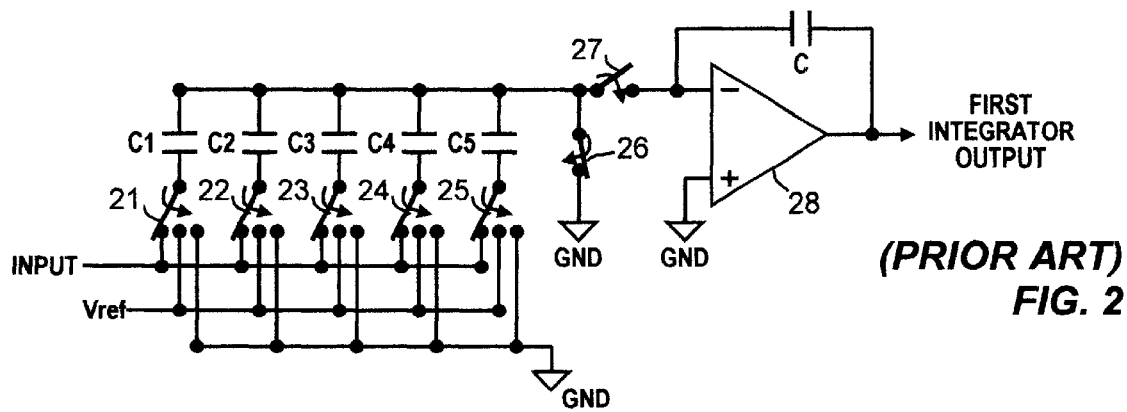
FIG. 2 illustrates a schematic diagram of a 5-level switched-capacitor D/A converter incorporated with first stage integrator of the multi-bit sigma-delta A/D converter known in the prior art.
Figure 3:
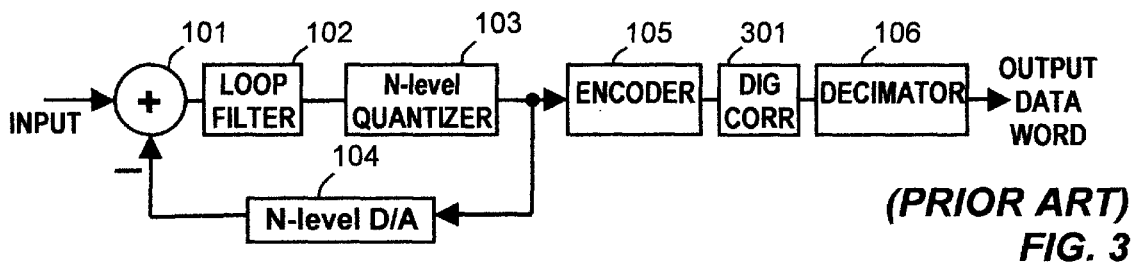
FIG. 3 illustrates a block diagram of a multi-bit sigma-delta analog-to-digital (A/D) converter employing digital correction technique to reduce the element mismatch known in the prior art.
Figure 4:
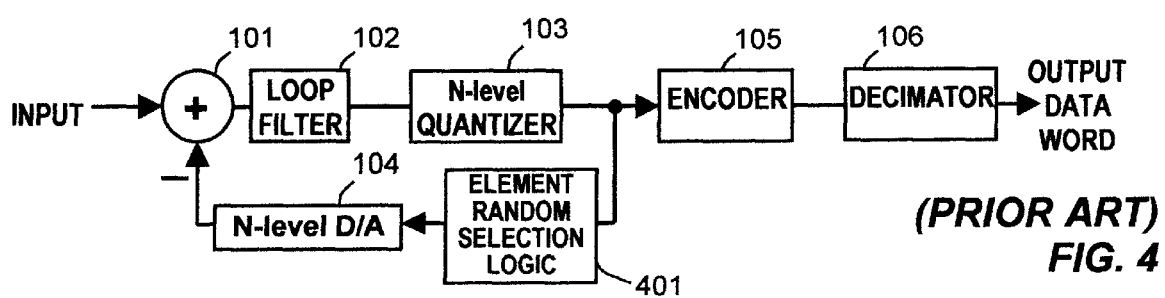
FIG. 4 illustrates a block diagram of a multi-bit sigma-delta analog-to-digital (A/D) converter employing dynamic element matching technique known in the prior art.
Figure 5:
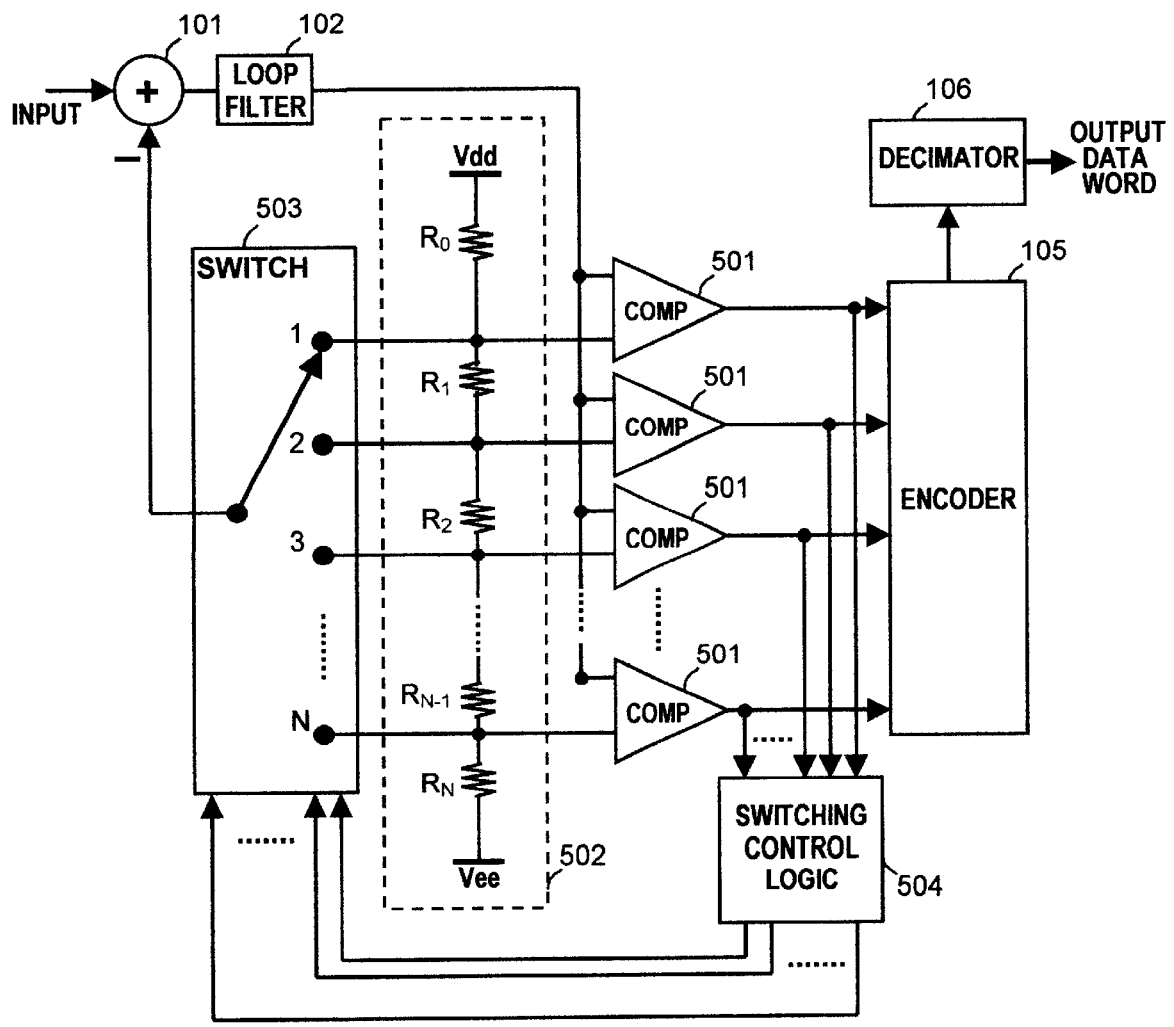
FIG. 5 is a block diagram of an embodiment of a multi-bit sigma-delta A/D converter in accordance with the present invention.

Referring now to FIG. 5, the summer 101 receives analog input signals from its first input terminal and feedback signals from its second input terminal, and outputs summed signals to the loop filter 102. N comparators 501 are configured in parallel where N is an integer greater than one. One of the two inputs of each of the N comparators is connected together to the output of the loop filter 102. A voltage divider network 502 divides a reference voltage signal into various voltage levels, which are applied to the other input terminals of the N comparators 501 and also to a switch 503 that has single pole and N throws through its N throws. Inside the voltage divider network 502, a resistor type divider is shown as an example, in which a plurality of resistors, labelled as $R_0, R_1, R_2 \ldots R_N$, are connected in series to divide reference voltage difference signal (Vdd–Vee) into N voltage levels, where Vdd and Vee are two different voltage levels though one of them is often grounded. The resistors $R_0, R_1, R_2 \ldots R_N$, can be weighted either equally or in other manners. Obviously other types of voltage dividers can be used to provide the same function too. The N comparators 501 output N-level digital thermometer code, which is supplied to encoder 105 and switching control logic unit 504. The switching control logic unit 504 transforms the N-level digital thermometer code into appropriate digital control signals that can be used to control the switch 503. The single pole of the switch 503 is connected to the second input terminal of the summer 101 negatively, that completes the feedback loop.

Therefore the N comparators 501 and the voltage divider network 502 in FIG. 5 function as a multi-level quantizer, whereas the switch 503, the voltage divider network 502 and the switching control logic 504 function as a multi-level digital-to-analog (D/A) converter. The multi-level digital-to-analog (D/A) converter is incorporated with the multi-level quantizer in the multi-bit sigma-delta analog-to-digital (A/D) converter. Instead of summing electrical energy from multiple D/A elements found in conventional D/A converter, the multi-level D/A converter according to the present invention employs the switch 503 to direct the divided reference voltages, which are also used by the multi-level quantizer thus means no cost of additional circuit, to the summer 101. This is feasible because at each instant one of the divided reference voltages actually represents the digital output of the multi-level quantizer. As is well known, it is this very digital output that should be fed back in analog form to the second input of the summer in the sigma-delta analog-to-digital (A/D) converter. The use of switch 503 and the switching control logic 504 ensures that the correct reference voltage level correspondent to the digital output is selected. Since there is no summation of electrical energy from multiple D/A elements found in conventional D/A converter, the multi-level D/A converter according to the present invention can reduce element mismatch significantly and reduce circuit complexity of the multi-bit sigma-delta A/D converter too.

Figure 6:
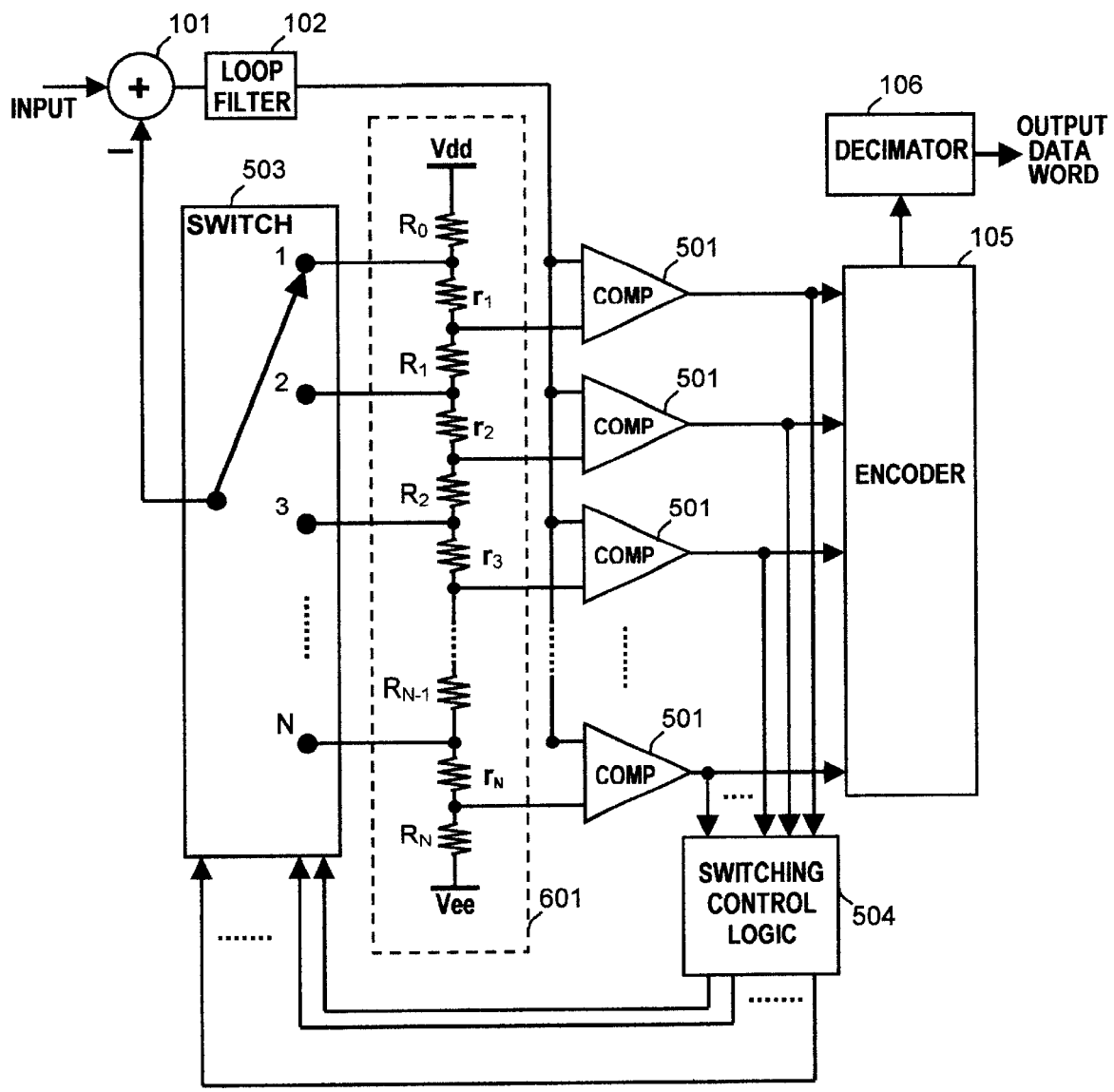
FIG. 6 is a block diagram of another embodiment of the multi-bit sigma-delta A/D converter in accordance with the present invention.

Referring now to FIG. 6, which shows another embodiment of the present invention, the voltage divider network 601, which is slightly different from the voltage divider network 502 in FIG. 5, divides the reference voltage difference into 2N voltage levels. Among the 2N voltage levels, N of them are applied to the N comparators 501 and other N are applied to the switch 503 so that the feedback voltage signals are offset with the reference voltages that are applied to the N comparators 501, giving extra control on the multi-level D/A converter output. Note that in FIG. 5., the two voltages are the same. Again a resistor type divider is shown as an example, in which a plurality of resistors, labelled as $R_0, r_i, R_1, r_2, R_2 \ldots R_{N-1}, r_N, R_N$, are connected in series to divide reference voltage difference signal (Vdd–

Vee) into 2N voltage levels, where Vdd and Vee are two different voltage levels though one of them is often grounded. The resistors $R_0, r_1, R_1, r_2, R_2 \ldots R_{N-1}, r_N, R_N$, can be weighted either equally or in other manners. Obviously other types of voltage dividers can be used to provide the same function too.

Figure 7:
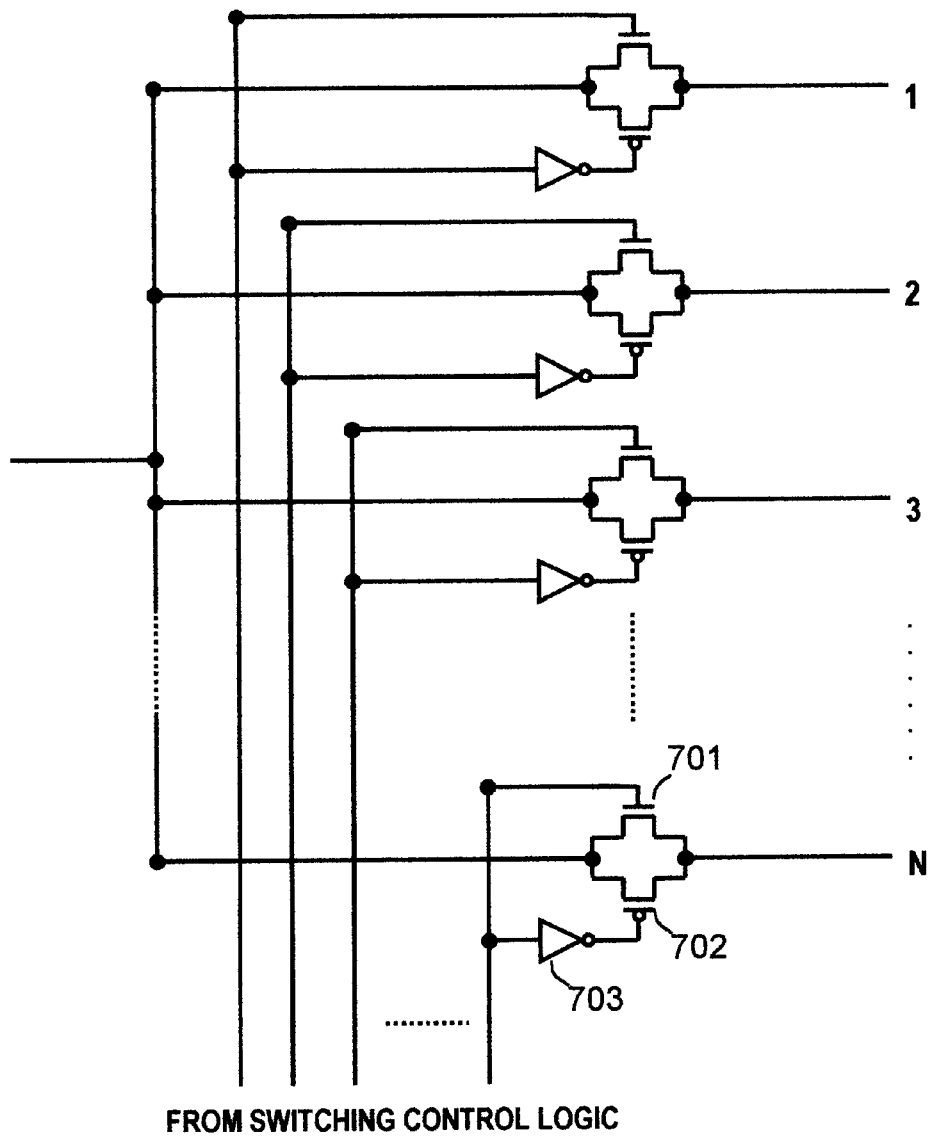
FIG. 7 is a schematic diagram of a switch in accordance with the invention, depicting a preferred manner of providing single pole N throw switching.

Referring now to FIG. 7, which shows a preferred implementation example of the switch 503 in FIG. 5 and FIG. 6 according to the present invention, N CMOS transistors are configured in parallel. Each CMOS transistor includes NMOS transistor 701 and PMOS transistor 702; an inverter 703 is connected to the gate of PMOS transistor 702, thus a single pole N throw switch is formed. It is understandable that other types of switches can be used to provide the same function too.

The invention has been described in preferred forms and method by way of examples. It will be understood by those skilled in the art that various changes and modifications may be made to the embodiments without departing from the sprit or scope of the invention. It is not intended that the invention be limited in any way to the embodiments shown and described herein and it is intended that the invention be limited only by the claims appended hereto.

What is claimed is:

1. A multi-bit sigma-delta analog-to-digital (A/D) converter, comprising:
    a summer having a first input for analog input signals and a second input for analog feedback signals;
    a loop filter of filtering the summed signals supplied by the output of said summer;
    N comparators configured in parallel, each of said N comparators having a first input and a second input, said N comparators outputting digital thermometer code, where N is an integer greater than one;
    a switch having single pole and N throws, in which said single pole can be connected to each of said N throws by digital control, said single pole being externally connected to said second input of said summer in negative sense;
    a voltage divider network of dividing a voltage reference signal into various voltage levels, which are applied to said N second inputs of said N comparators and to said N throws of said switch;
    a switching control logic unit that transforms said digital thermometer code supplied by said N comparators into digital control signals used to control said switch;
    an encoder that transforms said digital thermometer code supplied by said N comparators into binary code; and
    a digital decimation filter in connection with said encoder.

2. The multi-bit sigma-delta A/D converter of claim 1, wherein said N first inputs of said N comparators are connected together to the output of said loop filter.

3. The multi-bit sigma-delta A/D converter of claim 1, wherein said voltage divider network divides said voltage reference signal into N voltage levels, which are applied to said N second inputs of said N comparators and also to said N throws of said switch.

4. The multi-bit sigma-delta A/D converter of claim 1, wherein said voltage divider network divides said voltage reference signal into 2N voltage levels, of which N levels are applied to said N second inputs of said N comparators and other N levels are applied to said N throws of said switch.

5. The multi-bit sigma-delta A/D converter of claim 1, wherein said switch comprises a plurality of CMOS transistors configured in parallel with their gates being digitally controlled by said switching control logic unit.

6. The multi-bit sigma-delta A/D converter of claim 1, wherein said N second inputs of said N comparators are connected in parallel to said voltage divider network so that each of said N second inputs of said N comparators receives one of said voltage levels.

7. The multi-bit sigma-delta A/D converter of claim 1, wherein said N throws of said switch are connected in parallel to said voltage divider network so that each of said N throws receives one of said voltage levels.

8. The multi-bit sigma-delta A/D converter of claim 1, wherein said N comparators and said voltage divider network function as a multi-level quantizer.

9. The multi-bit sigma-delta A/D converter of claim 1, wherein said switch, said voltage divider network and said switching control logic unit function as a multi-level digital-to-analog (D/A) converter in the feedback path of said multi-bit sigma-delta A/D converter.

10. A multi-level digital-to-analog (D/A) converter that is incorporated with a multi-level quantizer to reduce element mismatch in a multi-bit sigma-delta analog-to-digital (A/D) converter, comprising:
    N comparators configured in parallel, each of said N comparators having a first input and a second input, said N comparators outputting digital thermometer code, where N is an integer greater than one;
    a switch having single pole and N throws, in which said single pole can be connected to each of said N throws by digital control, said single pole being the output of said multi-level D/A converter;
    a voltage divider network of dividing a voltage reference signal into various voltage levels, which are applied to said N second inputs of said N comparators and to said N throws of said switch; and
    a switching control logic unit that transforms said digital thermometer code supplied by said N comparators into digital control signals used to control said switch.

11. The multi-level D/A converter of claim 10, wherein said N first inputs of said N comparators are connected together as input of said multi-level quantizer.

12. The multi-level D/A converter of claim 10, wherein said voltage divider network divides said voltage reference signal into N voltage levels, which are applied to said N second inputs of said N comparators and also to said N throws of said switch.

13. The multi-level D/A converter of claim 10, wherein said voltage divider network divides said voltage reference signal into 2N voltage levels, of which N levels are applied to said N second inputs of said N comparators and other N levels are applied to said N throws of said switch.

14. The multi-level D/A converter of claim 10, wherein said switch comprises a plurality of CMOS transistors configured in parallel with their gates being digitally controlled by said switching control logic unit.

15. The multi-level D/A converter of claim 10, wherein said N second inputs of said N comparators are connected in parallel to said voltage divider network so that each of said N second inputs of said N comparators receives one of said voltage levels.

16. The multi-level D/A converter of claim 10, wherein said N throws of said switch are connected in parallel to said voltage divider network so that each of said N throws receives one of said voltage levels.

* * * * *